United States Patent [19]

Tsuru

[11] Patent Number: 5,449,965
[45] Date of Patent: Sep. 12, 1995

[54] OSCILLATOR

[75] Inventor: Yoshikazu Tsuru, Nishinomiya, Japan

[73] Assignee: Matsushita Electric Industrial Co., Ltd., Osaka, Japan

[21] Appl. No.: 135,531

[22] Filed: Oct. 13, 1993

[30] Foreign Application Priority Data

| Oct. 15, 1992 | [JP] | Japan | 4-276931 |
|---|---|---|---|
| Apr. 19, 1993 | [JP] | Japan | 5-091111 |
| Apr. 19, 1993 | [JP] | Japan | 5-091113 |
| Apr. 19, 1993 | [JP] | Japan | 5-091114 |
| Apr. 19, 1993 | [JP] | Japan | 5-091115 |
| Apr. 20, 1993 | [JP] | Japan | 5-092794 |
| Jun. 10, 1993 | [JP] | Japan | 5-138201 |

[51] Int. Cl.⁶ .................... H03H 9/10; H01L 41/053
[52] U.S. Cl. .................... 310/351; 310/361; 310/367; 310/340; 310/349
[58] Field of Search ........ 310/321, 340, 348, 351–353, 310/361, 367, 368, 370

[56] References Cited

U.S. PATENT DOCUMENTS

| 3,634,787 | 1/1972 | Newell | 310/321 |
|---|---|---|---|
| 4,063,910 | 12/1977 | Huguenin et al. | 51/413 |
| 4,293,986 | 10/1981 | Kobayashi et al. | 310/370 |
| 4,362,961 | 12/1982 | Gerber | 310/370 |
| 4,451,754 | 5/1984 | Stolz et al. | 310/348 |
| 4,609,844 | 9/1986 | Nakamura et al. | 310/321 |
| 5,059,853 | 10/1991 | Kawashima | 310/367 |
| 5,198,716 | 3/1993 | Godshall et al. | 310/353 |
| 5,233,261 | 8/1993 | Wajid | 310/364 |

FOREIGN PATENT DOCUMENTS

| 0017103 | 10/1980 | European Pat. Off. | H03H 9/19 |
|---|---|---|---|
| 0459631 | 12/1991 | European Pat. Off. | H03H 9/19 |
| 2336806 | 7/1977 | France | H01L 41/04 |
| 2339892 | 8/1977 | France | G04F 5/06 |
| 2441960 | 6/1980 | France | H03H 9/05 |
| 0077690 | 6/1977 | Japan | 310/370 |
| 0049013 | 4/1980 | Japan | 310/370 |
| 0199313 | 12/1982 | Japan | 310/370 |
| 2029092 | 3/1980 | United Kingdom | H03H 9/10 |
| 1568985 | 6/1980 | United Kingdom | H03H 9/10 |

Primary Examiner—Thomas M. Dougherty
Attorney, Agent, or Firm—Stevens, Davis, Miller & Mosher

[57] ABSTRACT

An oscillator has a pair of upper and lower casing members in the form of plates, and a vibration plate pinched between the upper and lower casing members. A tongue-like vibrating portion is formed by forming a slit in the vibration plate inside an outer peripheral portion of the vibration plate pinched between the upper and lower casing members. Electrodes are formed on obverse and reverse surfaces of the vibrating portion.

15 Claims, 7 Drawing Sheets

OSCILLATOR

BACKGROUND OF THE INVENTION

1. Field of the Invention

This invention relates to an oscillator for use in various kinds of electric products.

2. Description of the Related Art

Oscillators are widely used as local oscillators in communication apparatuses or the like. FIG. 5 shows an example of the conventional oscillators of this kind.

In a lower casing member 1 shown in FIG. 5, a vibration plate 2 is provided. The vibration plate 2 has a plate-like shape, as shown in FIG. 6, and electrodes 3 are provided on obverse and reverse surfaces of the vibration plate 2. An upper case 4 is so shaped as to be placed over an opening in the upper surface of the lower casing member 1 to sealingly close the opening.

In the above-described arrangement, the vibration plate 2 is fixed in the lower casing member 1 by a bonding strength of an electroconductive adhesive 5.

The thus-constructed conventional oscillator entails a problem that it is very difficult to stabilize the vibration of the vibration plate 2. That is, the oscillator of this kind is very small and, naturally, the lower casing member 1 and the vibration plate 2 are small. Therefore, it is very difficult to correctly set the vibration plate 2 in a predetermined position in the lower casing member 1. As a result, a peripheral portion of the vibration plate 2 contacts an inner surface of the lower casing member 1, so that the stability of vibration is thereby reduced.

SUMMARY OF THE INVENTION

In view of this problem, an object of the present invention is to provide an oscillator in which the vibration of a vibration plate is stabilized.

To achieve this object, according to the present invention, there is provided an oscillator comprising upper and lower casing members in the forms of plates and a vibration plate interposed between the upper and lower casing members, wherein a slit is formed in the vibration plate inside the outer peripheral portion of the vibration plate pinched between the upper and lower casing members to form a tongue-like vibrating portion, and electrodes are formed on obverse and reverse surfaces of the vibrating portion.

In this structure, a suitable gap can be maintained by forming the slit around the tongue-like vibrating portion. It is thereby possible to avoid the problem of the conventional art, i.e., to prevent a part of the vibrating portion from contacting the upper and lower casing members to impede the desired vibration.

DESCRIPTION OF THE PREFERRED EMBODIMENTS

Embodiment 1

Figure 1:
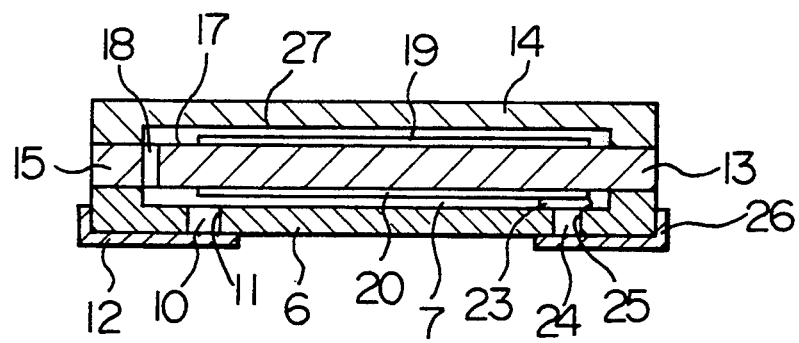
FIG. 1 is a cross-sectional view of an oscillator in accordance with first, fourth and fifth embodiments of the present invention.
Figure 2:
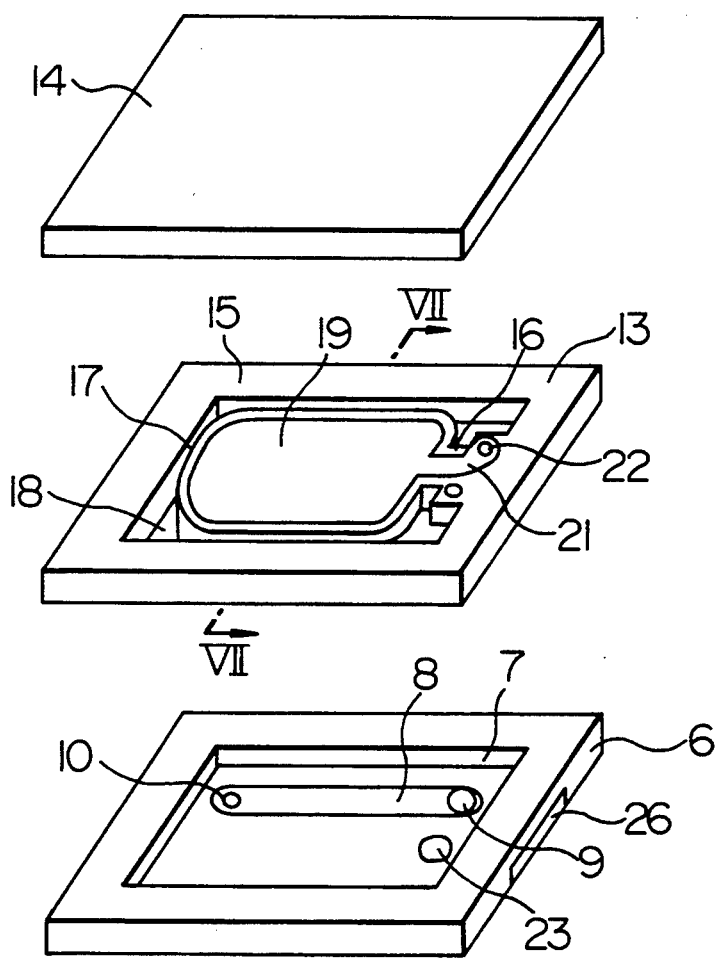
FIG. 2 is an exploded perspective view of the oscillator shown in FIG. 1.

Referring to FIGS. 1 and 2, a lower casing member 6 has a rectangular shape and has a recess 7 formed in its upper surface. An electroconductive pattern 8 is formed in the recess 7. An electroconductive adhesive 9 is provided on the electroconductive pattern 8 at one end thereof, while a through hole 10 is formed in the pattern 8 at the other end thereof. As shown in FIG. 1, an electroconductive layer 11 is formed on an inner surface of the through hole 10 by electroless plating. An electrode 12 formed on an outer bottom surface of the lower casing member 6 and the electroconductive pattern 8 are electrically connected to each other through the conductive layer 11.

A vibration plate 13 is formed of quartz crystal and includes an outer peripheral frame portion 15 pinched between the outer peripheral portions of the upper and lower casing members 14 and 6, as shown in FIG. 1.

The vibration plate 13 has an inner vibrating portion 17 provided on a small-width supporting portion 16 which extends inwardly from an inner portion of the frame portion 15 so as to form a cantilever together with the vibrating portion 17. That is, a generally-U-shaped slit 18 is formed by etching or sandblasting between the vibrating portion 17 and the frame portion 15 except at the supporting portion 16. The width of the supporting portion 16 is reduced in comparison with that of the vibrating portion to ensure that the vibration of the vibrating portion 17 is not easily transmitted to the supporting portion 16.

The vibrating portion 17 is formed in such a manner that corners of a rectangle are rounded when the slit 18 is formed. Electrodes 19 and 20 are provided on the obverse and reverse surfaces of the vibrating portion 17. The obverse-surface electrode 19 is connected to the electroconductive adhesive 9 through an electroconductive pattern 21 formed on the supporting portion 16 and through an electroconductive layer formed in a through hole 22. The reverse-surface electrode 20 is connected to an electrode 26 provided on an outer bottom surface of the lower casing member 6 through an electroconductive adhesive 23 and an electroconductive layer 25 provided in a through hole 24 formed in the lower casing member 6.

The upper casing member 14 is formed of silicon and has, as shown in FIG. 1, a recessed portion 27 formed in its inner surface, whereby a vibration space sufficiently large in the up-down direction of the vibrating portion 17 is provided. The above-described structure is made by a manufacturing method described below. First, the frame portion 15 of the vibration plate 13 is placed on the lower casing member 6. In this state, these members are pressed against each other while being heated. Because the abutting surfaces of these members are formed as flat surfaces, they are connected by interatomic coupling. During the heating and pressing, gaseous materials caused by heating escape above the members through the slit 18 and other portions. Degassing through and above the slit 18 is important since a plug formed of glass is press-fitted in each of the through holes 10 and 24 in the lower casing member 6.

Next, the oscillation frequency of the vibrating portion 17 is measured by applying a signal across the electrodes 12 and 26, and frequency adjustment (e.g., trimming) based on this measurement is performed. Thereafter, the upper casing member 14 is placed on the frame portion 15 of the vibration plate 13 and these members are also pressed against each other while being heated so that interatomic coupling of flat surfaces thereof is caused, thereby connecting the members tightly and integrally.

The manufacture of one vibrator has been described. Actually, however, a plurality of sets of the upper casing members 14, the vibration plates 13 and the lower casing members 6 are arranged in large sheets and are superposed each other to integrally combine the members as described above. Each set of the three members is separated from others by being cut off in accordance with the outer peripheral configuration of the frame portion 15 to obtain a vibrator such as that shown in FIG. 1. After this cutting, electrodes 12 and 26 are formed.

Embodiment 2

Figure 3:
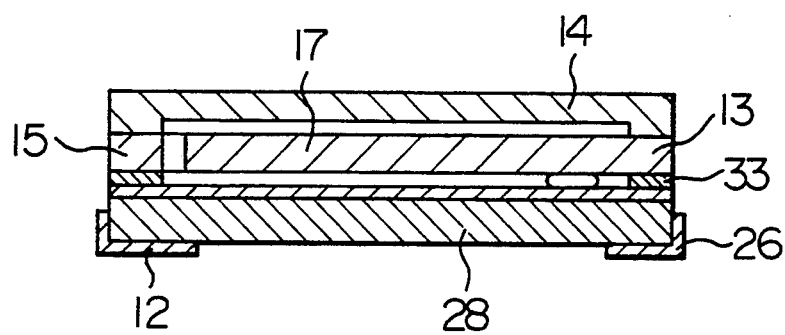
FIG. 3 is a cross-sectional view of an oscillator in accordance with a second embodiment of the present invention.
Figure 4:
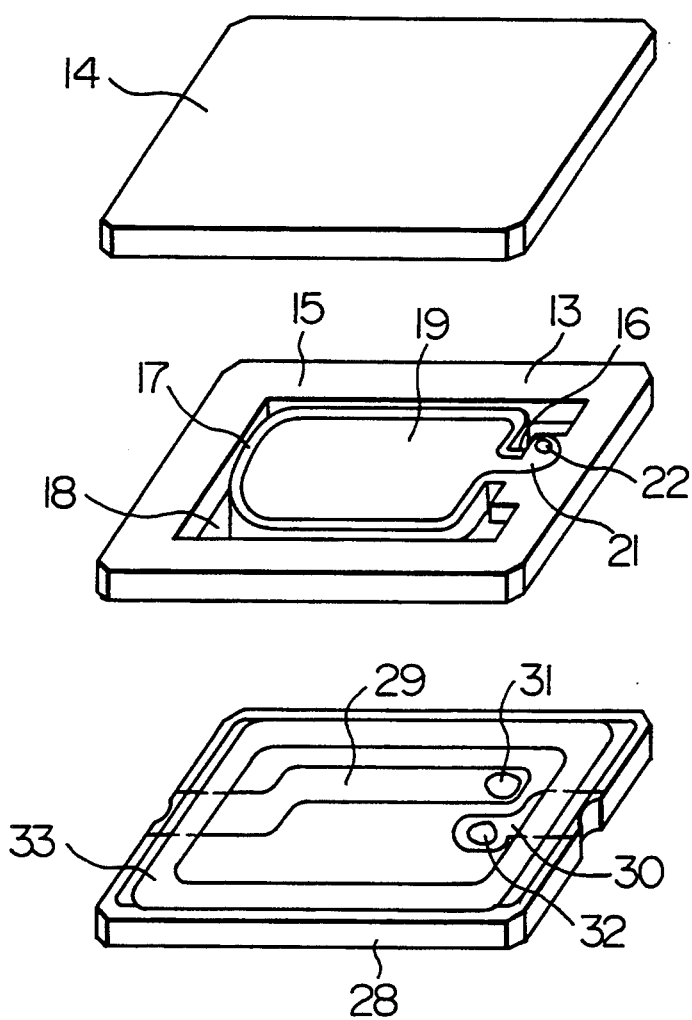
FIG. 4 is an exploded perspective view of the oscillator shown in FIG. 3.
Figure 5:
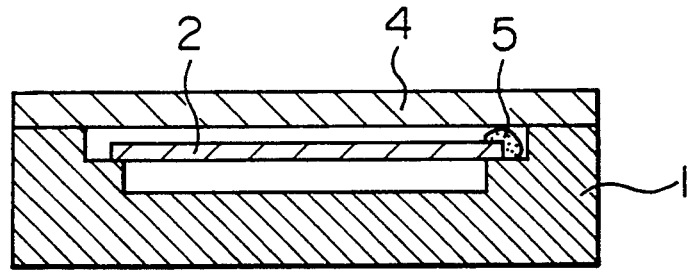
FIG. 5 is a cross-sectional view of the conventional oscillator.
Figure 6:
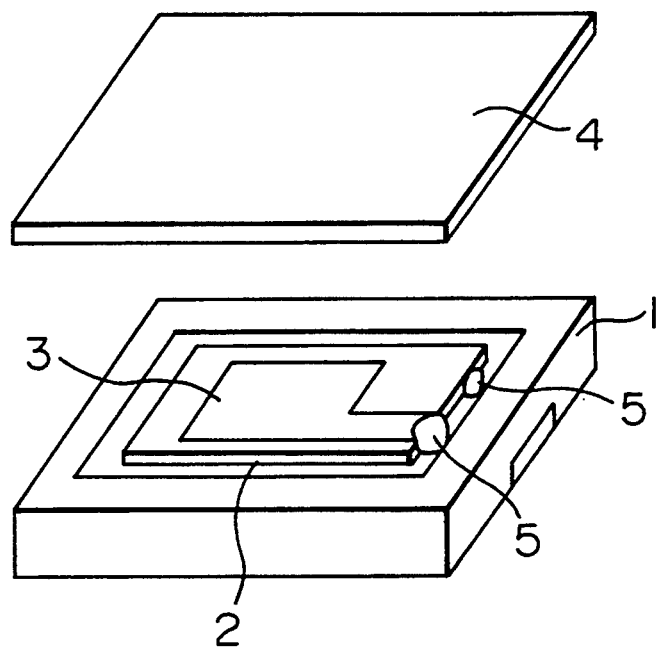
FIG. 6 is an exploded perspective view of the oscillator shown in FIG. 5.

FIGS. 3 and 4 show a second embodiment of the present invention in which a lower casing member 28 is formed of alumina. An electroconductive pattern 29, which serves as the electroconductive pattern 8 shown in FIG. 2, is formed on an upper surface of the lower casing member 28 and extends from the left-hand side thereof. An electroconductive pattern 30 is also formed to extend from the right-hand side. Electroconductive adhesive pads 31 and 32 are provided on end portions of these electroconductive patterns. An insulating layer, not shown, formed of glass is so formed on the upper surface of the lower casing member 28 as to expose only the adhesive pads 31 and 32, and a coating of a brazing material 33 is applied to a portion of the insulating layer corresponding to an outer peripheral portion of the lower casing member 28 so as to form a thick layer thereon.

That is, the brazing material 33 connects the lower casing member 28 to a vibration plate 13 while maintaining a vibration space below a vibrating portion 17 of the vibration plate 13. In this embodiment, corner edge-portions of an upper casing member 14, the vibration plate 13 and the lower casing member 28 are cut off. Specifically, edge cutting of the vibration plate 13 and the lower casing member 28 is intended to release gases generated from the brazing material 33. That is, the gases cannot escape unless such cut edges are formed, since a plurality of vibrators are formed from large sheets as described above.

Embodiment 3

Figure 7:
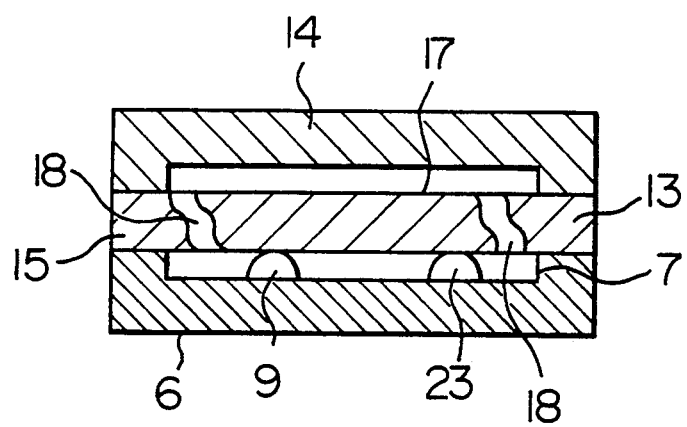
FIG. 7 is a cross-sectional view of an oscillator in accordance with a third embodiment of the present invention.

FIG. 7 shows a cross section of a third embodiment of the present invention taken along the line VII—VII in FIG. 2. In this embodiment, when the slit 18 between the vibrating portion 17 and the frame portion 15 of the vibration plate 13 is formed, the vibration plate 13 is worked by sandblasting while being inclined in such a manner that one of its two longer sides is higher than the other. As a result, outer peripheral ends of the tongue-like vibrating portion 17 corresponding to the longer sides thereof have slanted sectional configurations, as shown in FIG. 7. Needless to say, shorter-side portions of the vibration portion 17 may be also formed so as to have slanted sectional configurations.

If at least a portion of the outer peripheral end surface of the tongue-like vibration plate 17 is slanted in this manner, the principal vibration generated in a central portion of the vibrating portion 17 can be prevented from being reflected by the peripheral end to cause an unwanted response, so that the vibration of the vibration plate 17 can be stabilized.

Also, if the slit 18 is formed by sandblasting, the outer peripheral end surface of the vibrating portion 17 is roughened, as shown in FIG. 7.

Roughening the outer peripheral end surface of the tongue-like vibrating portion 17 in this manner is also effective to prevent the principal vibration generated in the central portion of the vibration plate 17 from being reflected at the outer peripheral end to cause an unwanted response. The vibration of the vibrating portion 17 is therefore stabilized thereby.

Embodiment 4

A fourth embodiment of the present invention will be described with reference to FIGS. 1 and 2. In this embodiment, a lower casing member 6 shown in FIGS. 1 and 2 has the shape of a rectangular plate, is formed of quartz crystal and has a recess 7 formed in its upper surface. An electroconductive pattern 8 is formed in the recess 7. An electroconductive adhesive 9 is provided on the electroconductive pattern 8 at one end thereof, and a through-hole 10 is formed in the pattern 8 at the other end thereof. As shown in FIG. 1, an electroconductive layer 11 is formed on an inner surface of the through hole 10 by electroless plating. An electrode 12 formed on an outer bottom surface of the lower casing member 6 and the electroconductive pattern 8 are electrically connected each other through the conductive layer 11.

A vibration plate 13 is formed of quartz crystal and has an outer peripheral frame portion 15 pinched between the outer peripheral portions of upper and lower casing members 14 and 6 each formed of quartz crystal, as shown in FIG. 1.

The vibration plate 13 has a vibrating portion 17 provided on a small-width supporting portion 16 which extends inwardly from an inner portion of the frame potion 15 so as to form a cantilever together with the vibrating portion 17. That is, a generally-U-shaped slit 18 is formed between the vibrating portion 17 and the frame portion 15 by etching or sandblasting.

The vibrating portion 17 is formed in such a manner that corners of a rectangle are rounded, when the slit 18 is formed. Electrodes 19 and 20 are provided on obverse and reverse surfaces of the vibrating portion 17. The obverse-surface electrode 19 is connected to the electroconductive adhesive 9 through an electroconductive pattern 21 formed on the supporting portion 16 and through an electroconductive layer formed in a through hole 22. The reverse-surface electrode 20 is connected to an electrode 26 provided on an outer bottom surface of the lower casing member 6 through an electroconductive adhesive 23 and an electroconductive layer 25 provided in a through hole 24 formed in the lower casing member 6.

The upper casing member 14 is formed of quartz crystal into the shape of a plate and has, as shown in FIG. 1, a recessed portion 27 formed in its inner surface, whereby a vibration space sufficiently large in the up-down direction of the vibrating portion 17 is provided. The above-described vibrator is made by a manufacturing method described below. First, the frame portion 15 of the vibration plate 13 is placed on the lower casing member 6. In this state, these members are pressed against each other while being heated. Because the abutting surfaces of these members are formed as flat surfaces, they are connected by interatomic coupling between quartz crystal atoms thereof. Also, during the heating and pressing, gaseous materials caused by heating escape above the members through the slit 18 and other portions. Degassing through and above the slit 18 is important since a plug formed of glass is press-fitted in each of the through holes 10 and 24 in the lower casing member 6.

Next, the oscillation frequency of the vibrating portion 17 is measured by applying a signal between the electrodes 12 and 26, and frequency adjustment (e.g., trimming) based on this measurement is performed. Thereafter, the upper casing member 14 is placed on the frame portion 15 and these members are also pressed against each other while being heated so that interatomic coupling between quartz crystal flat surfaces thereof is caused, thereby connecting the members tightly and integrally.

The manufacture of one vibrator has been described. Actually, however, a plurality of sets of the upper casing members 14, the vibration plates 13 and the lower casing members 6 are arranged in large sheets and are superposed on each other to integrally combine the members as described above. Thereafter, each set of the three members is separated by being cut off in accordance with the outer peripheral configuration of the frame portion 15 to obtain a vibrator, as shown in FIG. 1. After this cutting, electrodes 12 and 26 are formed.

In this embodiment, each of the upper and lower casing members 14 and 6 and the vibration plate 13 is formed of a quartz crystal plate in order to reduce the occurrence of a residual stress caused by a warp or a deformation due to the difference in linear thermal expansion coefficient so that the vibration of the vibrating portion 17 is stabilized.

Also, in this embodiment, the upper and lower casing members 14 and 6 are heated to a temperature higher than 573° C. corresponding to the transition point of quartz, thereby reducing the Q-values of these members relative to that of the vibration plate 13. This is because, if a metallic plate is disposed close to and outside the upper or lower casing member 14 or 6, which is formed of quartz crystal, the upper or lower casing member may resonate unnecessarily with the electrode 19 or 20 of the vibrating portion 17 to adversely affect the vibration of the vibrating member 17. The Q-value setting in accordance with this embodiment is intended to prevent such a phenomenon.

In this embodiment, as described above, since the upper and lower casing members 14 and 6 and the vibration plate 13 are all formed of quartz crystal, the occurrence of a residual stress caused by a warp or a deformation due to the difference in linear thermal expansion coefficients is thereby reduced to stabilize the vibration.

Embodiment 5

A fifth embodiment of the present invention is structured such that a surface of at least one of the upper and lower casing members 14 and 6 shown in FIGS. 1 and 2 adjacent the vibration plate 13 is roughened, and an electroconductive pattern 8 electrically connected to the electrodes 12 and 26 is formed on the roughened surface.

In this arrangement, the Q-value of at least one of the upper and lower casing members is reduced by roughening the surface thereof adjacent the vibrating plate to reduce unnecessary vibrations of the upper or lower casing member 14 or 6. Moreover, since the external-lead electroconductive pattern 8 is formed on the roughened surface, the possibility of separation or the like of the electroconductive pattern 8 is reduced.

Embodiment 6

A sixth embodiment of the present invention will be described with reference to FIGS. 8 to 10.

Figure 8:
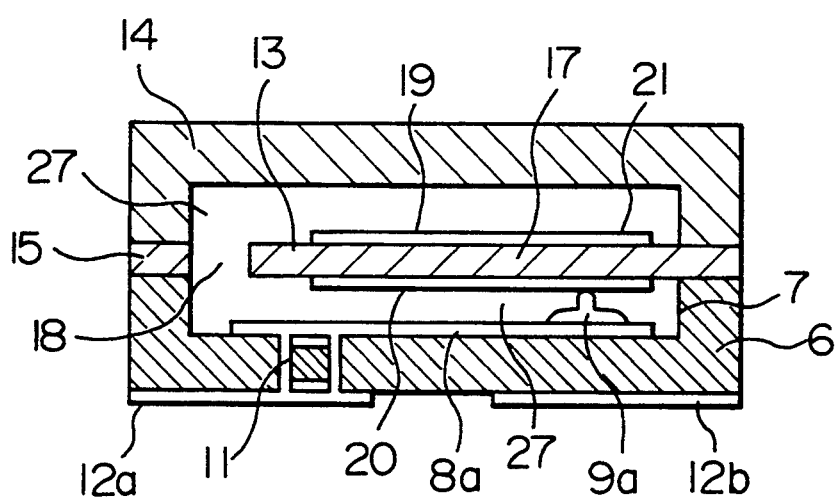
FIG. 8 is a cross-sectional view of an oscillator in accordance with a sixth embodiment of the present invention.
Figure 9:
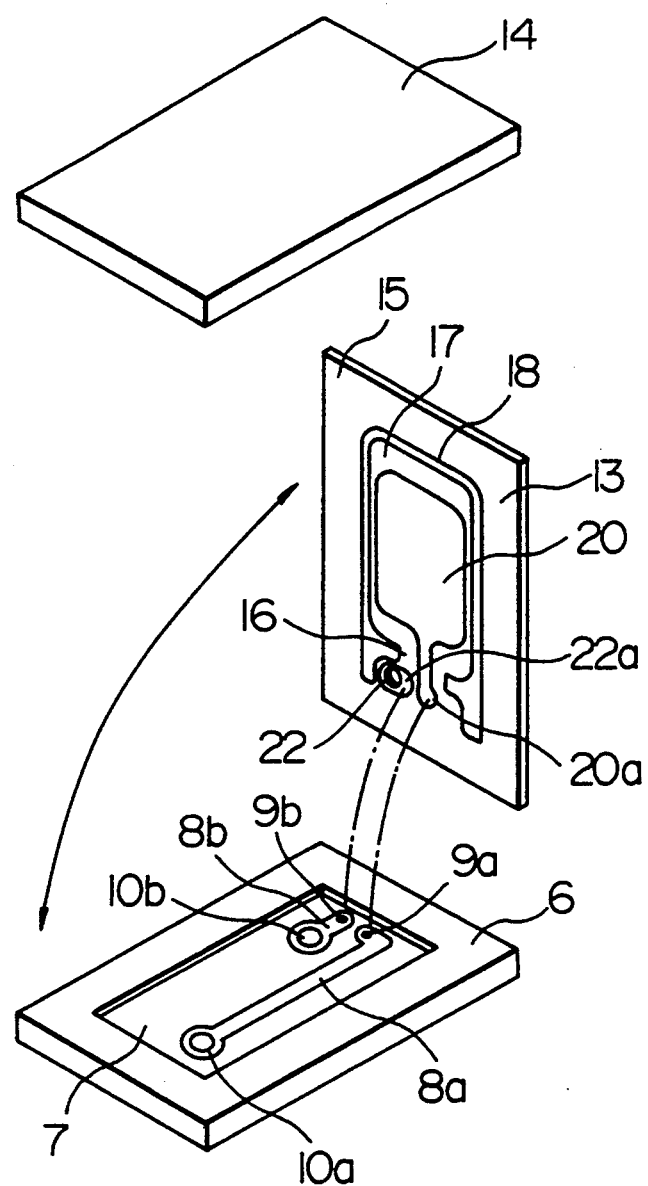
FIG. 9 is an exploded perspective view of the oscillator shown in FIG. 8.
Figure 10:
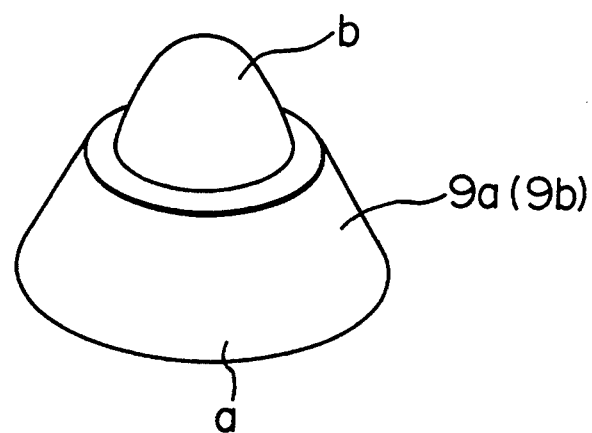
FIG. 10 is a perspective view of a protrusion electrode of the oscillator shown in FIG. 8.

Referring to FIGS. 8 and 9, a lower casing member 6 has the shape of a rectangular plate, is formed of quartz crystal and has a recess 7 formed in its upper surface. Electroconductive patterns 8a and 8b of gold or silver are formed in the recess 7. Protrusion electrodes 9a and 9b shown in FIG. 10 and formed of gold or silver are provided on the electroconductive patterns 8a and 8b at one end thereof, and through-holes 10a and 10b are formed in the patterns 8a and 8b at the other ends thereof. As shown in FIG. 8, an electroconductive layer 11 of gold or silver is formed on an inner surface of each of the through holes 10a and 10b. Electrodes 12a and 12b formed on an outer bottom surface of the lower casing member 6 and the electroconductive patterns 8a and 8b are electrically connected each other through the conductive layer 11.

A vibration plate 13 is formed of quartz crystal and has an outer peripheral frame portion 15 pinched between the outer peripheral portions of upper and lower casing members 14 and 6 each formed of quartz crystal, as shown in FIG. 8.

The vibration plate 13 has a vibrating portion 17 provided on a small-width supporting portion 16 which extends inwardly from an inner portion of the frame portion 15 so as to form a cantilever together with the vibrating portion 17. That is, a generally-U-shaped slit 18 is formed between the vibrating portion 17 and the frame portion 15 by etching or sandblasting.

The vibrating portion 17 is formed in such a manner that corners of a rectangle are rounded when the slit 18 is formed. Electrodes 19 and 20 are provided on obverse and reverse surfaces of the vibrating portion 17. The obverse-surface electrode 19 is connected to the protrusion electrode 9b through an electroconductive pattern 21 formed on the supporting portion 16, an electroconductive layer in a through-hole 22 and a lead-out portion 22a extending from this electroconductive layer. The reverse-surface electrode 20 is connected to the protrusion electrode 9a through its lead-out portion 20a.

Each of the plate-like upper casing members 14 and 6 formed of quartz crystal has, as shown in FIG. 8, a recessed portion 27 formed in its inner surface, whereby a vibration space sufficiently large in the up-down direction of the vibrating portion 17 is provided. Each of the through-holes 10a and 10b is closed with a glass plug. The above-described structure is made by a manufacturing method described below. First, the frame portion 15 of the vibration plate 13 is placed on the lower casing member 6. In this state, these members are pressed against each other while being heated. Because the abutting surfaces of these members are formed as flat surfaces, they are connected by interatomic coupling between quartz crystal atoms thereof. The protrusion electrodes 9a and 9b are previously implanted in the electrode patterns 8a and 8b by application of both ultrasonic waves and heat, and each of the protrusion electrodes 9a and 9b is shaped in such a manner that, as shown in FIG. 10, a needle-like protrusion b is formed on an upper surface of a seat portion a having the shape of a trancated cone. Therefore, the protrusion b of each protrusion electrodes 9a and 9b is crushed in contact with the lead-out portion 20a or 22a by pressing of the vibration plate 13 on the lower casing member 6. By the above-mentioned heating in this state, the protrusion electrode and the lead are welded to each other by diffusion of gold or silver thereof.

Next, the oscillation frequency of the vibrating portion 17 is measured by applying a signal across the electrodes 12a and 12b, and frequency adjustment (e.g., trimming) based on this measurement is performed. Thereafter, the upper casing member 14 is placed on the frame portion 15 and these members are also pressed against each other while being heated so that interatomic coupling between quartz crystal flat surfaces thereof is caused, thereby connecting the members tightly and integrally.

The manufacture of one vibrator has been described. Actually, however, a plurality of sets of the upper casing members 14, the vibration plates 13 and the lower casing members 6 are arranged in large sheets and are superposed on each other to integrally combine the members as described above. Thereafter, each set of the three members is separated from the others by being cut off in accordance with the outer peripheral configuration of the frame portion 15 to obtain a vibrator such as that shown in FIG. 8. After this cutting, electrodes 12a and 12b are formed.

In this embodiment, each of the upper and lower casing members 14 and 6 and the vibration plate 13 is formed of a quartz crystal plate in order to reduce the occurrence of a residual stress caused by a warp or a deformation due to the difference in linear thermal expansion coefficient so that the vibration of the vibrating portion 17 is stabilized.

Preferably, the upper surface portion of the vibration plate 13 facing the protrusion electrodes 9a and 9b is urged downward by a projection integrally formed on the upper casing member 14, that is, the plate 13 is pinched between the protrusion electrodes 9a and 9b and the projection on the upper casing member 14.

In the sixth embodiment, as described above, the lead-out portions 20a and 22a of the electrodes 19 and 20 on the vibration plate 13 and the electroconductive patterns 8a and 8b on the inner surface of at least one of the upper and lower casing members 14 and 6 are connected by the protrusion electrodes 9a and 9b, and, therefore, the problem of occurrence of gases impeding the vibration, which is encountered in the case of using an electroconductive adhesive for connection between the electrodes or electroconductive patterns, can be avoided.

Embodiment 7

Figure 11:
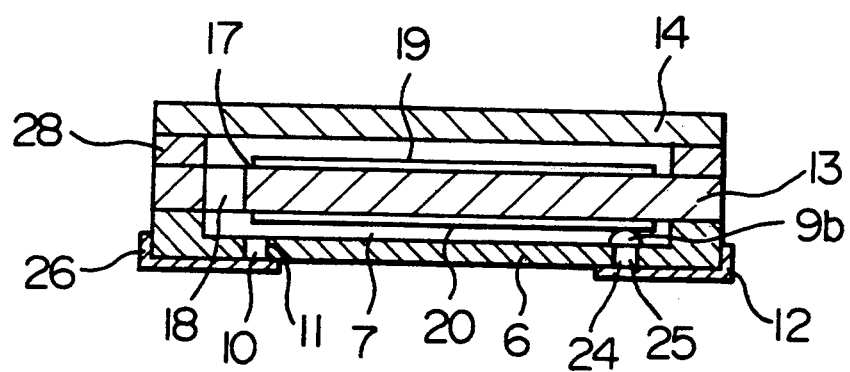
FIG. 11 is a cross-sectional view of an oscillator in accordance with a seventh embodiment of the present invention.
Figure 12:
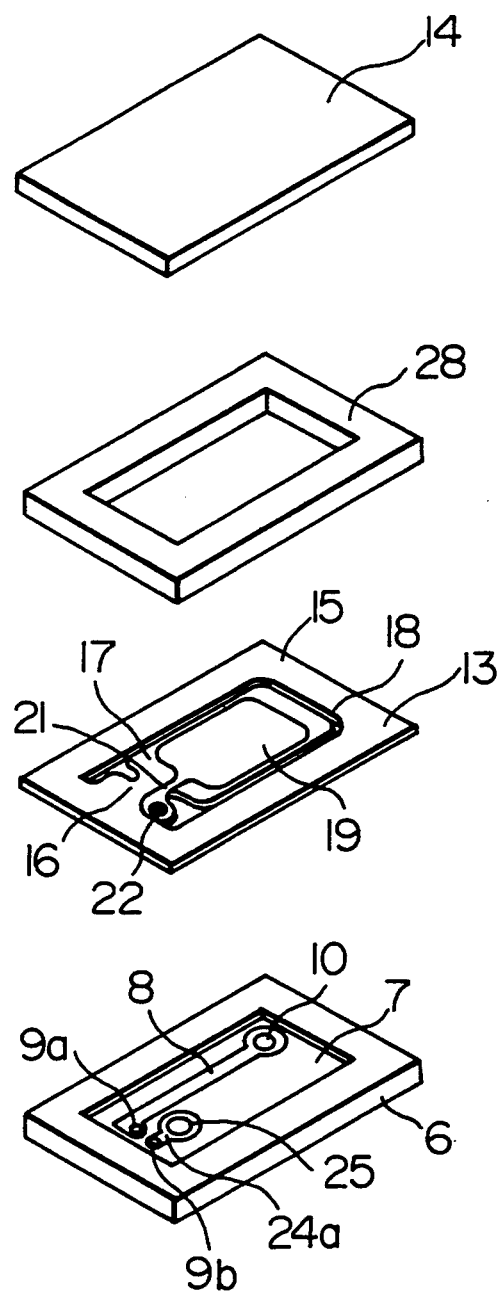
FIG. 12 is an exploded perspective view of the oscillator shown in FIG. 11.

FIGS. 11 and 12 show a seventh embodiment of the present invention.

A lower casing member 6 shown in FIGS. 11 and 12 is formed of quartz crystal into a rectangular shape and has a recess 7 formed in its upper surface. An electroconductive pattern 8 is formed in the recess 7. A protrusion electrode 9a is provided on the electroconductive pattern 8 at one end thereof, while a through-hole 10 is formed in the pattern 8 at the other end thereof. As shown in FIG. 11, an electroconductive layer 11 is formed on an inner surface of the through-hole 10 by electroless plating. An electrode 26 formed on an outer bottom surface of the lower casing member 6 and the electroconductive pattern 8 are connected each other through the conductive layer 11.

A vibration plate 13 is formed of quartz crystal and has an outer peripheral frame portion 15 pinched between the outer peripheral portions of upper and lower casing members 14 and 6 each formed of quartz crystal, as shown in FIG. 11.

The vibration plate 13 has a vibrating portion 17 provided on a small-width supporting portion 16 which extends inwardly from an inner portion of the frame portion 15 so as to form a cantilever together with the vibrating portion 17. That is, a generally U-shaped slit 18 is formed between the vibrating portion 17 and the frame portion 15 by etching or sandblasting.

The vibrating portion 17 is formed in such a manner that corners of a rectangle are rounded when the slit 18 is formed. Electrodes 19 and 20 are provided on the obverse and reverse surfaces of the vibrating portion 17. The obverse-surface electrode 19 is connected to an electrode 12 provided on an outer bottom surface of the lower casing member 6 through an electroconductive pattern 21 on the supporting portion 16, an electroconductive layer in a through hole 22, a protrusion electrode 9b and an electroconductive pattern 24a on the lower casing member 6, and an electroconductive layer 25 in a through-hole 24 formed in the lower casing member 6. The reverse-surface electrode 20 is connected to the electrode 26 on the outer bottom surface through the protrusion electrode 9a and the electroconductive pattern 8 on the lower casing member 6, and through the conductive layer 11 in the through-hole 10.

A frame member 28 formed of quartz crystal is superposed on a surface of the frame portion 15 of the vibration plate 13 adjacent the upper casing member 14. The superposed surfaces of these members are flat surfaces and are connected to each other by interatomic coupling between quartz crystal atoms thereof. That is, to use the vibration plate 13 for high-frequency oscillation, it is necessary to reduce the thickness of the vibration plate 13. When the vibration plate 13 is worked into a member having a small thickness, the vibration plate 13 and the frame member 28 are first combined integrally with each other. The vibration plate 13 is polished in this state with the frame member 28 used as a reinforcement. The vibration plate 13 worked to be reduced in thickness is thereby prevented from being broken. In this manner, the desired high-frequency vibration plate 13 can be obtained. Thereafter, the slit 18 is formed in the vibration plate 13 by sandblasting. Then, the upper casing member 14 is integrally connected to an upper surface of the frame member 28, while the lower casing member 6 is integrally connected to a lower surface of the vibrating member 13.

The above-described vibrator is made by a manufacturing method described below. First, the frame portion 15 of the vibration plate 13 integrally connected to the frame member 28 is placed on the lower casing member 6. In this state, these members are pressed against each other while being heated. Because the abutting surfaces of these members are formed as flat surfaces, they are connected by interatomic coupling between quartz crystal atoms thereof. Also, during the heating and pressing, gaseous materials caused by heating escape above the members through the slit 18 and other portions. Degassing through and above the slit 18 is important since a plug formed of glass is press-fitted in each of the through-holes 10 and 24 in the lower casing member 6.

Next, the oscillation frequency of the vibrating portion 17 is measured by applying a signal across the electrodes 12 and 26, and frequency adjustment (e.g., trimming) based on this measurement is performed. Thereafter, the upper casing member 14 is placed on the frame member 28 and these members are also pressed against each other while being heated to cause interatomic coupling between quartz crystal atoms of flat surfaces thereof, thereby connecting the members tightly and integrally.

The manufacture of one vibrator has been described. Actually, however, a plurality of sets of the upper casing members 14, the frame members 28, the vibration plates 13 and the lower casing members 6 are arranged in large sheets and are superposed on each other to integrally combine the members as described above. Each set of the four members is separated by being cut off in accordance with the outer peripheral configuration of the frame portion 15 to obtain a vibrator such as that shown in FIG. 11. After this cutting, electrodes 12 and 26 are formed.

In accordance with the present invention, as described above, the upper and lower casing members in the form of plates and a vibration plate interposed between the upper and lower casing members are provided, a slit is formed in the vibration plate inside the outer peripheral portion of the vibration plate pinched between the upper and lower casing members to form a tongue-like vibrating portion, and electrodes are formed on the obverse and reverse surfaces of the vibrating portion. A suitable gap is formed by the slit around the tongue-like vibrating portion. It is thereby possible to avoid the problem of the conventional art, i.e., to prevent a part of the vibrating portion from contacting the upper and lower casing members to impede the desired vibration.

What is claimed is:

1. An oscillator comprising:
   a pair of upper and lower casing members in the form of plates; and
   a vibration plate pinched between said upper and lower casing members, a slit being formed in said vibration plate inside an outer peripheral portion of said vibration plate pinched between said upper and lower casing members to form a tongue-like vibrating portion, and electrodes formed on obverse and reverse surfaces of the vibrating portion;
   wherein at least a portion of an outer peripheral surface of said vibrating portion is slanted and a supporting portion of said vibration plate between said tongue-like vibrating portion and said portion pinched between said upper and lower casing members is reduced in width in comparison with said vibrating portion.

2. An oscillator according to claim 1, wherein said vibrating portion has a generally rectangular shape and has its corner portions rounded.

3. An oscillator comprising:
   a pair of upper and lower casing members in the form of plates; and
   a vibration plate pinched between said upper and lower casing members, a slit being formed in said vibration plate inside an outer peripheral portion of said vibration plate pinched between said upper and lower casing members to form a tongue-like vibrating portion, and electrodes formed on obverse and reverse surfaces of the vibrating portion;
   wherein at least a portion of an outer peripheral surface of said vibrating portion is slanted, a surface of at least one of said upper and lower casing members facing said vibration plate is roughened, and an external-lead electrode electrically connected to one of said electrodes on said vibrating portion is formed on the roughened surface.

4. An oscillator comprising:
   an upper casing member formed of quartz crystal and having a shape of a plate;
   a lower casing member formed of quartz crystal and having a shape of a plate; and
   a vibration plate pinched between said upper and lower casing members and formed of quartz crystal, a slit being formed in said vibration plate inside an outer peripheral portion of said vibration plate pinched between said upper and lower casing members to form a tongue-like vibrating portion, electrodes being formed on the vibrating portion;
   wherein at least a portion of an outer peripheral surface of said vibrating portion is slanted by sandblasting and is roughened and wherein said upper and lower casing members and said vibration plate except said tongue-like vibrating portion are directly coupled together.

5. An oscillator according to claim 4, wherein at least one of said upper and lower casing members has a Q-value smaller than a Q-value of said vibration plate.

6. An oscillator according to claim 4, wherein said outer peripheral surface of said vibrating portion is roughened.

7. An oscillator according to claim 4, wherein said upper and lower casing members and said vibration plate except said tongue-like vibrating portion are coupled together by interatomic coupling.

8. An oscillator according to claim 4, wherein said at least a portion of said outer peripheral surface of said vibrating portion is roughened by said sandblasting.

9. An oscillator according to claim 4, wherein said electrodes are formed on obverse and reverse surfaces of said vibrating portion.

10. An oscillator comprising:
    an upper casing member formed of quartz crystal and having a shape of a plate;
    a lower casing member formed of quartz crystal and having a shape of a plate; and
    a vibration plate pinched between said upper and lower casing members and formed of quartz crystal, a slit being formed in said vibration plate inside an outer peripheral portion of said vibration plate pinched between said upper and lower casing members to form a tongue-like vibrating portion, electrodes being formed on obverse and reverse surfaces of the vibrating portion;

wherein at least a portion of an outer peripheral surface of said vibrating portion is slanted, a surface of at least one of said upper and lower casing members facing said vibration plate is roughened, and an external-lead electrode electrically connected to one of said electrodes on said vibrating portion is formed on the roughened surface.

11. An oscillator comprising:
an upper casing member formed of quartz crystal and having a shape of a plate;
a lower casing member formed of quartz crystal and having a shape of a plate; and
a vibration plate pinched between said upper and lower casing members and formed of quartz crystal, a slit being formed in said vibration plate inside an outer peripheral portion of said vibration plate pinched between said upper and lower casing members to form a tongue-like vibrating portion, electrodes being formed on obverse and reverse surfaces of the vibrating portion, a lead-out portion of the electrode on at least one of the obverse and reverse surfaces and a connection portion provided on an inner surface of one of said upper and lower casing members opposed to said lead-out portion being connected to each other through a protrusion electrode, wherein at least a portion of an outer peripheral surface of said vibrating portion is slanted.

12. An oscillator according to claim 11, wherein the outer peripheral surface of said vibrating portion is slanted by sandblasting.

13. An oscillator according to claim 11, wherein a surface of at least one of said upper and lower casing members facing said vibration plate is roughened, and an external-lead electrode electrically connected to an electrode on said vibrating portion is formed on the toughened surface.

14. An oscillator according to claim 12, wherein said outer peripheral surface of said vibrating portion is roughened.

15. An oscillator comprising:
an upper casing member formed of quartz crystal and having a shape of a plate;
a lower casing member formed of quartz crystal and having a shape of a plate; and
a vibration plate pinched between said upper and lower casing members and formed of quartz crystal, a slit being formed in said vibration plate inside an outer peripheral portion of said vibration plate pinched between said upper and lower casing members to form a tongue-like vibrating portion, electrodes being formed on obverse and reverse surfaces of the vibrating portion, a lead-out portion of the electrode on at least one of the obverse and reverse surfaces and a connection portion provided on an inner surface of one of said upper and lower casing members opposed to said lead-out portion being connected to each other through a protrusion electrode, wherein an outer peripheral surface of said vibrating portion is roughened.

* * * * *